(12) United States Patent
Koumura et al.

(10) Patent No.: US 6,266,074 B1
(45) Date of Patent: Jul. 24, 2001

(54) LIGHT EMITTING APPARATUS WITH TEMPERATURE CONTROL, EXPOSURE APPARATUS, AND IMAGE FORMING APPARATUS

(75) Inventors: Noboru Koumura; Yukio Nagase; Izumi Narita, all of Shizuoka-ken; Seiji Mashimo, Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/419,783

(22) Filed: Oct. 18, 1999

(30) Foreign Application Priority Data

Oct. 22, 1998 (JP) ................................................ 10-300497
Oct. 22, 1998 (JP) ................................................ 10-300498
Oct. 22, 1998 (JP) ................................................ 10-300499

(51) Int. Cl.⁷ ............................ H05B 33/00; G03G 15/04
(52) U.S. Cl. ........................................... 347/133; 347/238
(58) Field of Search ................................. 347/130, 133, 347/237, 238; 257/88; 362/800

(56) References Cited

U.S. PATENT DOCUMENTS 5,694,330   12/1997  Iwamura et al. .
5,936,657 *  8/1999  Fork ..................................... 347/237

FOREIGN PATENT DOCUMENTS 2-24164 *  1/1990  (JP) .
2-233267 *  9/1990  (JP) .
3-269455 * 12/1991  (JP) .
5-318825 * 12/1993  (JP) .
6-45654 *  2/1994  (JP) .
8-244272 *  9/1996  (JP) .
10-35004 *  2/1998  (JP) .

* cited by examiner

*Primary Examiner*—Joan Pendegrass
(74) *Attorney, Agent, or Firm*—Fitzpatrick, Cella, Harper & Scinto

(57) ABSTRACT

Provided is a light emitting apparatus capable of preventing light emitting elements made of an organic compound from being affected by moisture in an ambience, thereby increasing their lifetime, and suitably applicable to an exposure section of the electrophotographic method. Temperature sensors are set next to a light emitter array which is an array of many light emitting elements made of the organic compound. A drive control unit of the array is composed of CPU, ROM, RAM, and I/O ports. The CPU carries out control of each unit according to input data of image information etc. and also carries out pre-heat control for the light emitting elements. The temperature sensors detect the temperature of the light emitting elements and the CPU, receiving their detection output, turns the light emitting elements or a heating element provided separately, on and off so that a detected temperature value becomes a predetermined value in a waiting state without the input data. In the waiting state the light emitting elements generate heat per se to be kept at the predetermined temperature.

20 Claims, 10 Drawing Sheets

LIGHT EMITTING APPARATUS WITH TEMPERATURE CONTROL, EXPOSURE APPARATUS, AND IMAGE FORMING APPARATUS

BACKGROUND OF THE INVENTION

1. Field of the Invention

The present invention relates to a light emitting apparatus, an exposure apparatus for carrying out exposure on a photosensitive body by use of the light emitting apparatus, and an image forming apparatus for forming an image by exposure on the photosensitive body. In the image forming apparatus of this type, the exposure is carried out on the photosensitive body by the electrophotographic method using the light emitting apparatus comprised of a plurality of light emitting elements, to form an image on this photosensitive body.

2. Related Background Art

The formation of an image by the electrophotographic method is a well known sequential process including steps of focusing an optical image from the light emitting apparatus on the photosensitive body to form a latent image thereon, developing the image with toner, transferring the image onto a transfer medium (paper), fixing the image thereon, and finally cleaning the photosensitive body.

In the image forming apparatus a laser optical system for scanning with a laser beam by use of a polygon mirror is commonly used as an exposure section for forming the latent image on the surface of the photosensitive body. The reason is the advantage of high resolution and high operation speed. The apparatus, however, needs to have a large space for placing such optical components as the polygon mirror, lenses, and so on, and it is thus not easy to downsize the structure of the apparatus. There is also a limit on how much the operation speed can be increased, because the scanning with the laser beam is effected by mechanical rotation of the polygon mirror.

Attention is thus being given to light emitting element arrays including a plurality of organic light emitting elements free of the above problems, as the light emitting apparatus. With the light emitting element arrays, the above problems of the placement space of the laser optical system and the limit of the operation speed do not arise, because the scanning is carried out using electric signals without need for the mechanical scanning and because the optical components such as the polygon mirror, lenses, and so on are not necessitated. In a specific structure the plurality of light emitting elements are each made of a transparent anode layer, an organic compound layer, and a cathode layer successively formed on a transparent substrate of a long beltlike shape and are arranged in a linear form. The organic compound layer is formed in a long beltlike shape as a common layer to the plurality of light emitting elements and is sandwiched between the anode and the cathode of a predetermined pattern on the top and bottom sides, to emit light individually.

The organic compound, however, has such a property that it is weak against water. On the other hand, the operation of the light emitting elements is characterized in that they are energized irregularly and discontinuously according to input data. For example, there often appear periods of a waiting state without input of data and the like during the operation and the temperature is lowered during such periods. Particularly, when the apparatus acts under high humidity circumstances, water is condensed to form dews around the light emitting elements. When the light emitting elements include the organic compound layer, the dews promote degradation of the light emitting elements, so as to pose the problem of shortening their lifetime accordingly.

SUMMARY OF THE INVENTION

An object of the present invention is to prevent the degradation of the light emitting elements due to water by solving the above problem. For accomplishing the object, the present invention provides a light emitting apparatus comprising a light emitting element array comprised of a plurality of organic light emitting elements and being arranged to drive the light emitting element array in accordance with input data, the light emitting apparatus comprising control means for performing such control that the light emitting elements are kept at a fixed temperature. Therefore, the temperature is prevented from varying during the operation of the light emitting elements, so that the condensation of water around the elements does not occur on the light emitting elements, thus preventing the degradation of light emitting elements.

In a specific embodiment, the apparatus further comprises temperature detecting means for detecting the temperature of the light emitting elements and the control means performs such control that the light emitting elements are kept at the fixed temperature in accordance with a detected temperature signal from the temperature detecting means.

In another embodiment, the apparatus further comprises heat generating means and the control means maintains the temperature of the light emitting elements constant by activating the heat generating means in accordance with the detected temperature signal.

DETAILED DESCRIPTION OF THE PREFERRED EMBODIMENTS

Embodiments of the present invention will be described by reference to the accompanying drawings.

Figure 1:
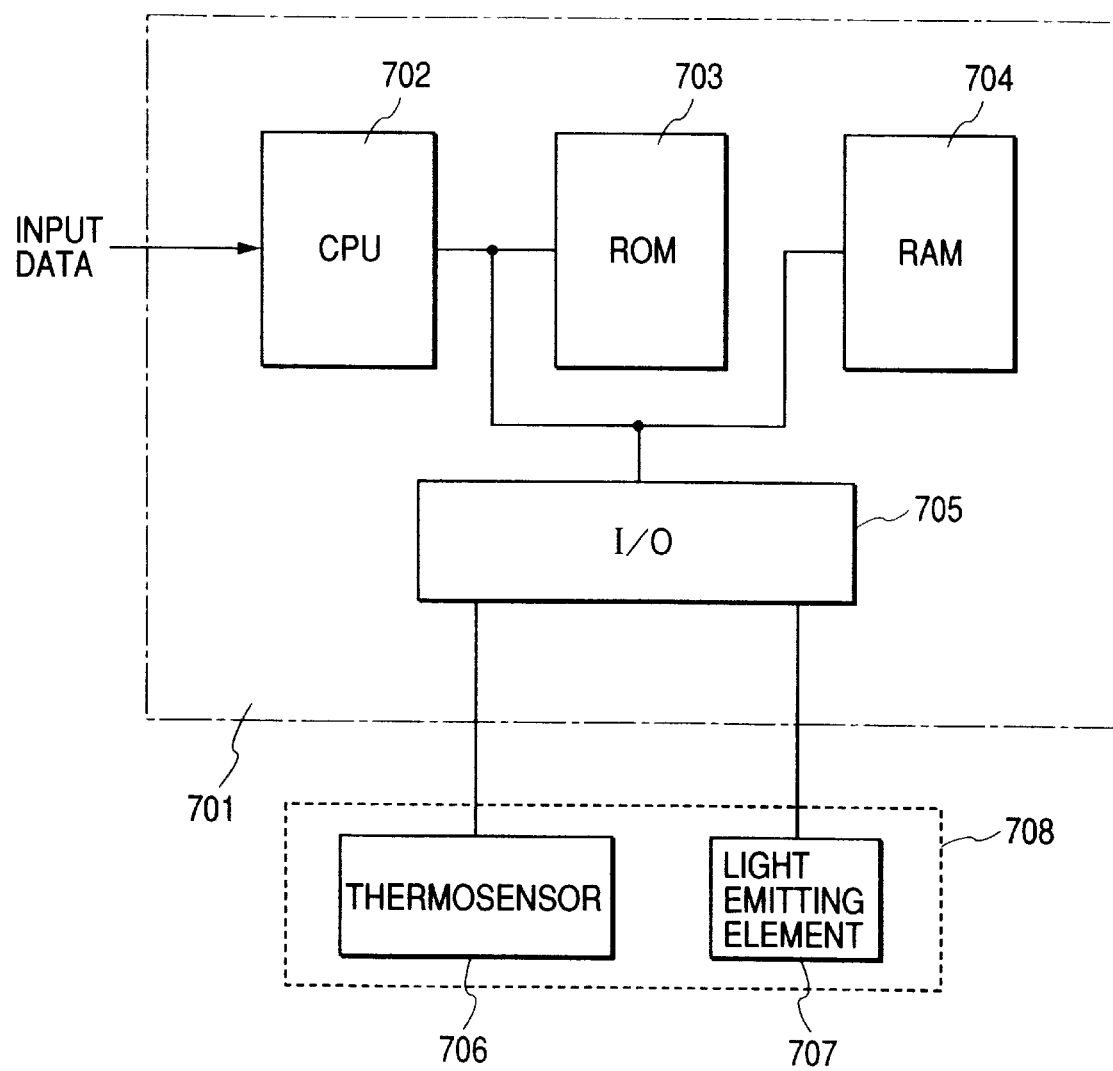
FIG. 1 is a diagram to show a light emitting apparatus according to the first embodiment of the present invention.
Figure 2:
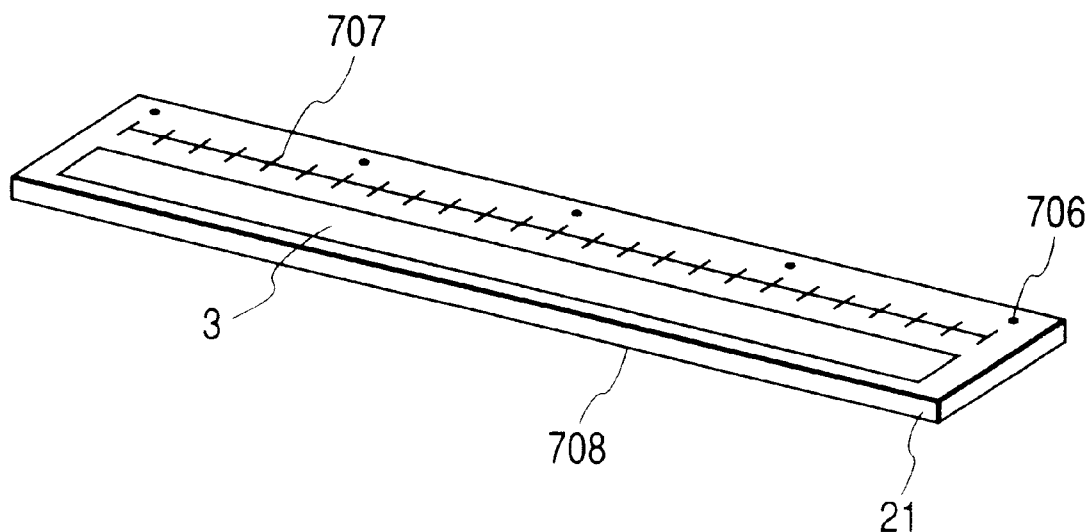
FIG. 2 is a perspective view of a light emitting element array used in the light emitting apparatus of FIG. 1.
Figure 3:
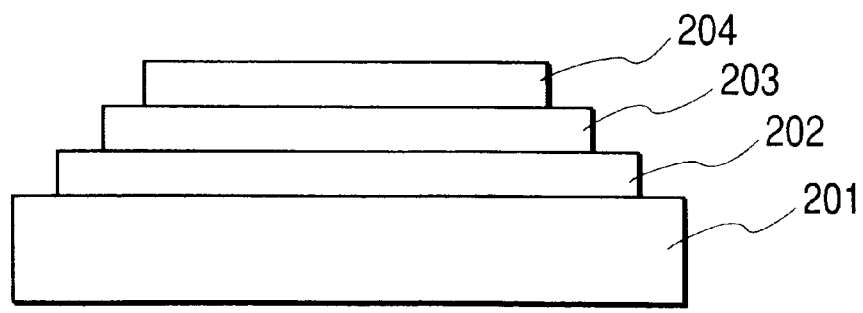
FIG. 3 is a sectional view to show a layer structure of the light emitting elements used in the light emitting apparatus of FIG. 1.
Figure 4:
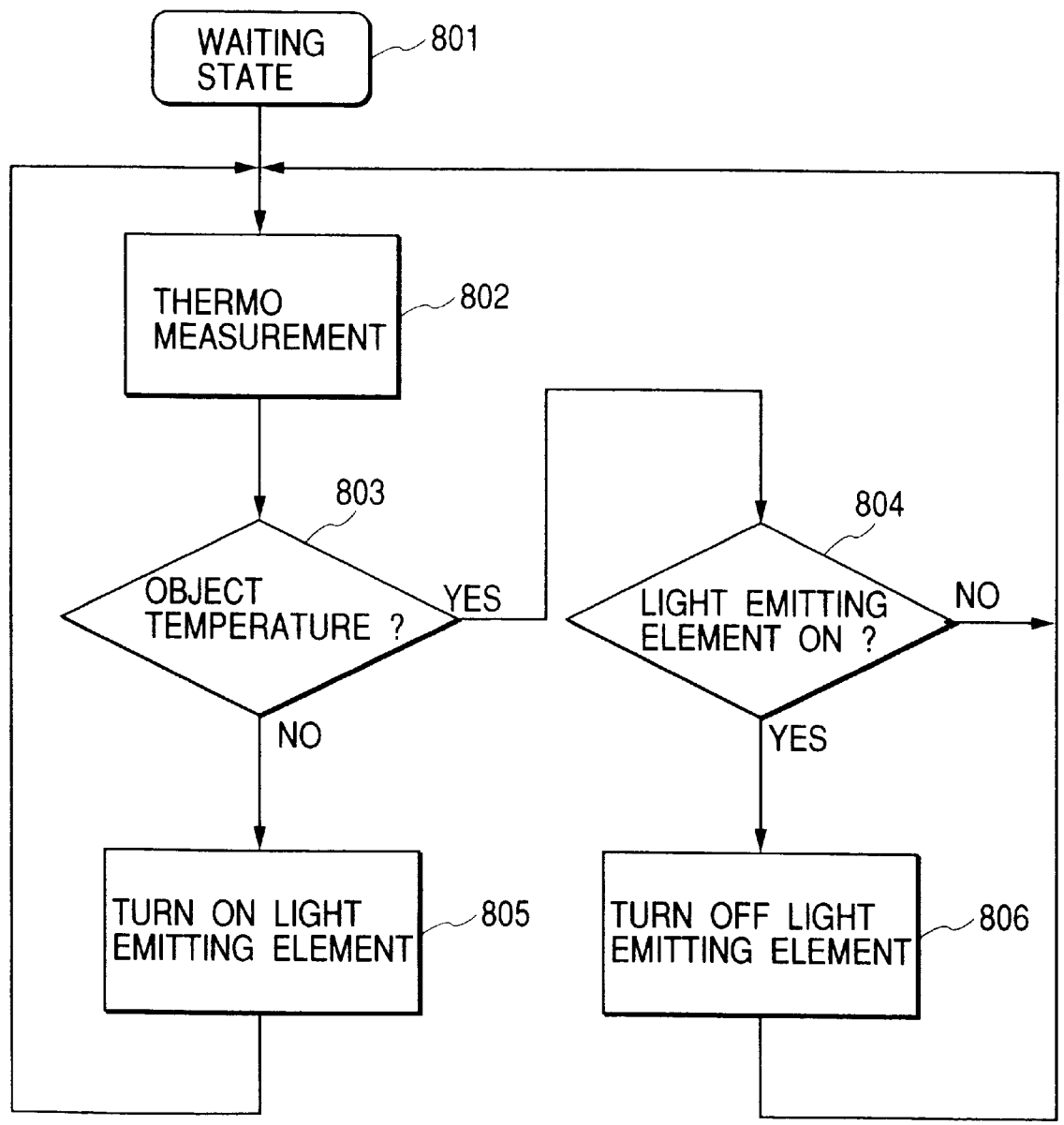
FIG. 4 is a flowchart to show pre-heat control of the light emitting elements of FIG. 1.
Figure 5:
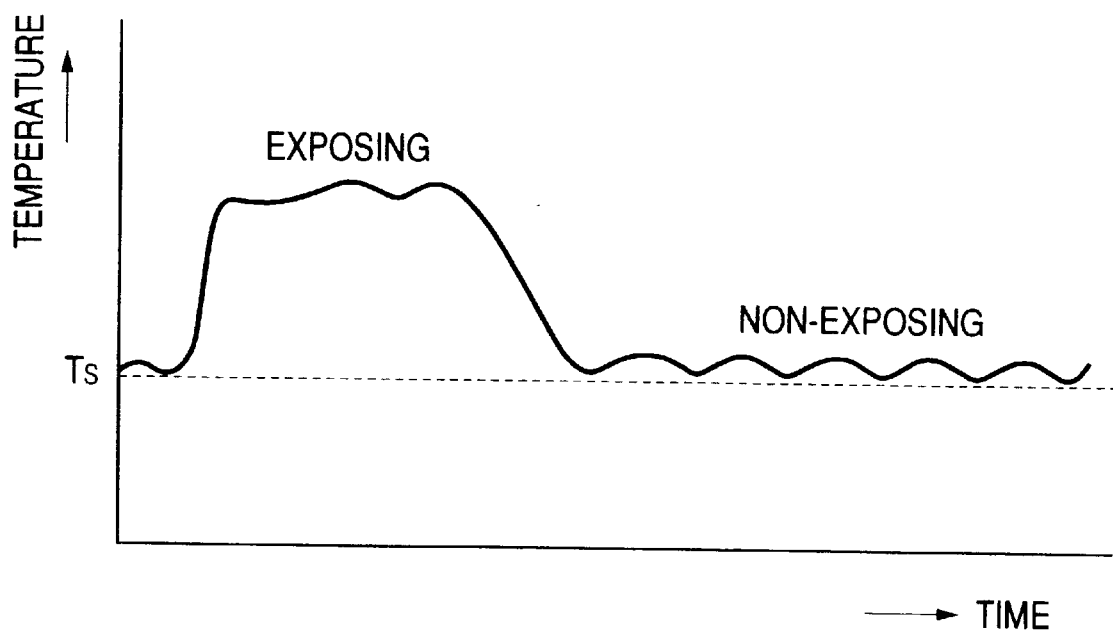
FIG. 5 is a diagram to show the result of measurement in which the temperature of the light emitting element array of FIG. 1 was measured.

FIG. 1 to FIG. 5 show the first embodiment of the present invention; FIG. 1 is a structural diagram of the light emitting apparatus and exposure apparatus of the present embodiment; FIG. 2 is a perspective view of its light emitter array; FIG. 3 is a sectional view to show the layer structure of the light emitting elements thereof; FIG. 4 is a flowchart of pre-heat control of the light emitting elements; FIG. 5 is a graph to show the result of measurement wherein the temperature of the light emitter array was measured.

This apparatus incorporates a light emitter array 708 and a drive control unit 701 therefor. The light emitter array 708 is composed of a number of light emitting elements 707 and temperature sensors 706. The drive control unit 701 is composed of CPU 702, ROM 703, RAM 704, and I/O ports 705. The CPU 702, ROM 703, RAM 704, and I/O ports 705 are connected via a control line, so that the CPU 702 capturing input data of image information etc. can transmit various data, addresses, etc. through the control line to each section. The I/O ports 705 are connected to the temperature sensors 706 and to the light emitting elements 707 by input/output lines, so that they can send and receive detection signals, driving signals corresponding to the input data of image information etc., and so on.

The light emitter array 708 has a lot of light emitting elements 707 arranged in a column (array) on a long-beltlike, transparent substrate 21 and a plurality of temperature sensors 706 are laid adjacent to the array at predetermined intervals. Further provided is a driver circuit pattern 3 for actuating the array of light emitting elements 707 to emit light in accordance with the image information, which is connected to the aforementioned I/O ports 705.

The array of light emitting elements 707 are so-called organic light emitting elements which are formed en bloc in a stack structure in which a transparent anode layer 202, an organic compound layer 203, and a cathode layer 204 are successively stacked on a transparent substrate 201, as illustrated in FIG. 3. The beltlike organic compound layer 203 is sandwiched between the electrode layers 202, 204 of a predetermined pattern on the top and bottom sides so that the array of light emitting elements for emitting light individually are formed en bloc.

The substrate 201 can be any material on a surface of which the light emitting elements can be retained. The substrate is preferably, for example, glass such as soda lime glass or the like, or a transparent insulating substrate of a resin film or the like.

Materials for the anode layer 202 are desirably those having large work functions and are, for example, ITO, tin oxide, gold, platinum, palladium, selenium, iridium, copper iodide, and so on. On the other hand, materials for the cathode layer 204 are desirably those having small work functions and are, for example, Mg/Ag, Mg, Al, In, alloys thereof, and so on.

The organic compound layer 203 may be formed in a single layer structure or in a multiple layer structure and is constructed, for example, of a hole transport layer into which holes are injected from the anode layer 202 and an electron transport layer into which electrons are injected from the cathode layer 204, either one of the hole transport layer and the electron transport layer serving as a light emitting layer. A phosphor layer containing a fluorescent material may also be interposed between the hole transport layer and the electron transport layer. Further, the organic compound layer may also be constructed in a single mixed layer structure serving as the hole transport layer, as the electron transport layer, and as the phosphor layer.

The hole transport layer can be made, for example, of N,N'-bis(3-methylphenyl)-N,N'-diphenyl-(1,1'-biphenyl)-4,4'-diamine (hereinafter referred to as TPD), and the material for the hole transport layer can also be selected from the following organic materials, as well as TPD.

Hole Transporting Compounds hole transport materials

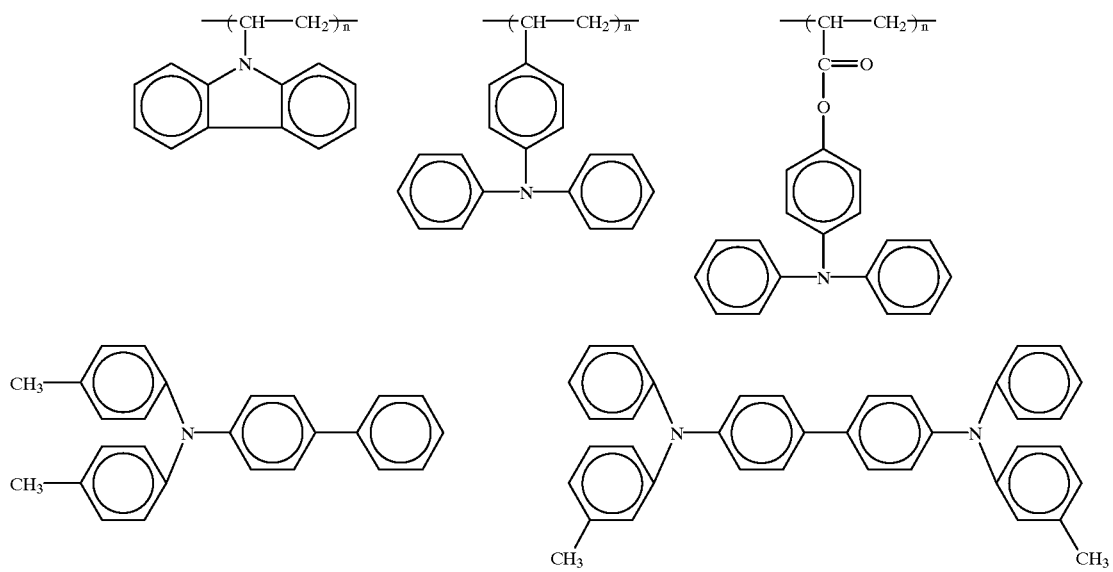

-continued
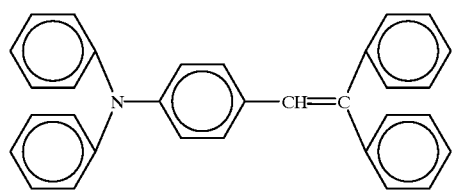
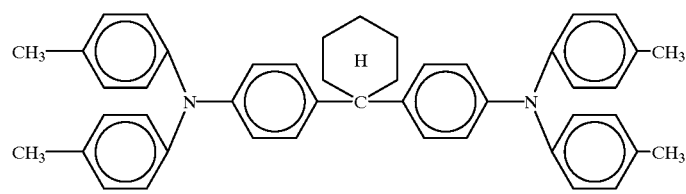
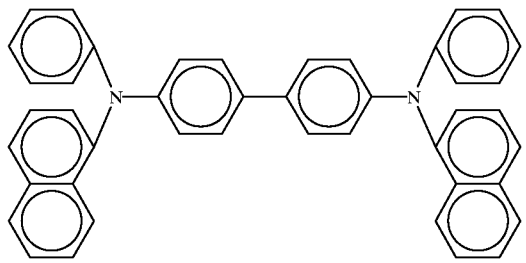
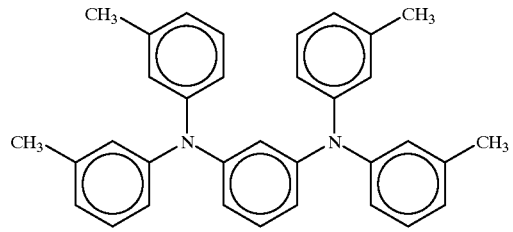
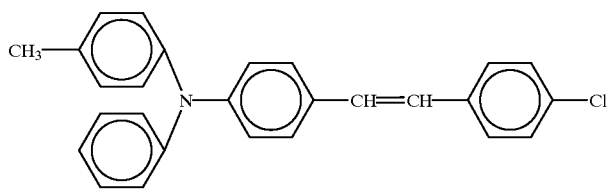
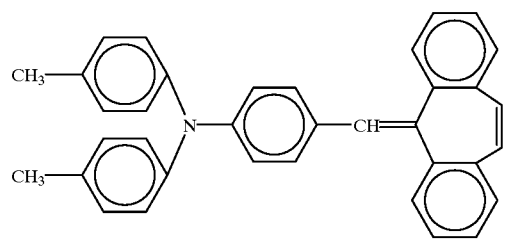
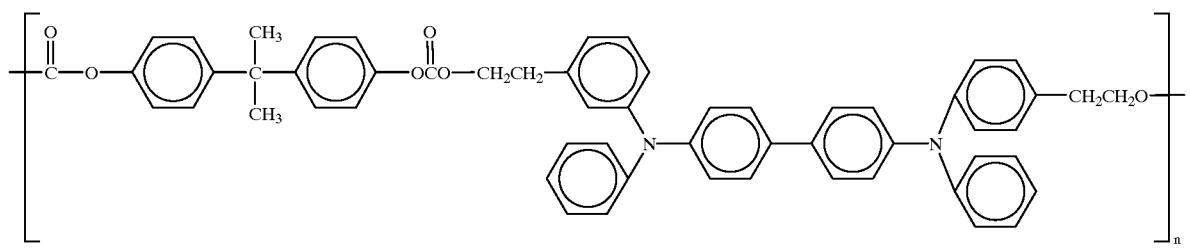
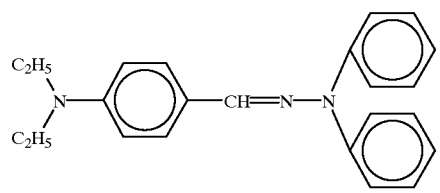
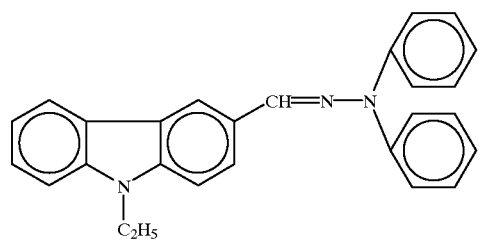
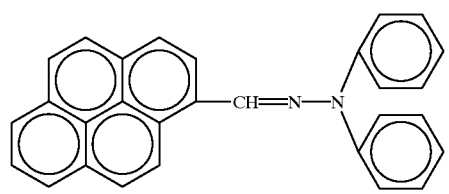
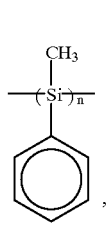
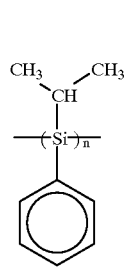
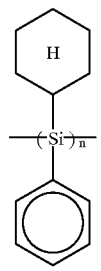
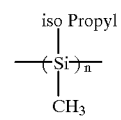

-continued

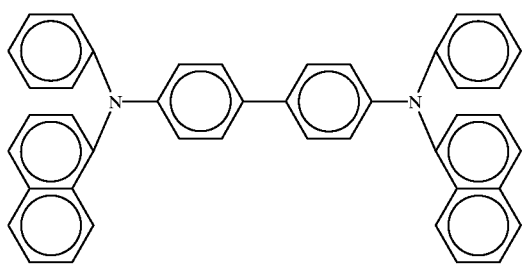
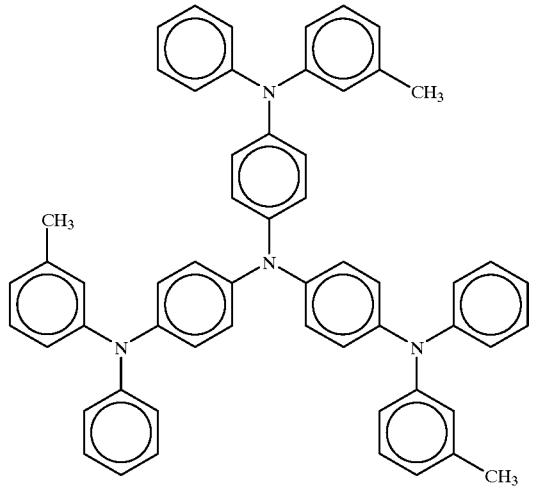

Further, inorganic materials, for example, such as a-Si, a-SiC, or the like may also be used.

The electron transport layer can be made, for example, of tris (8-quinolinol) aluminum (hereinafter referred to as Alq$_3$), and the electron transport layer can also be made of one selected from the following materials, in addition to Alq$_3$.

Electron Transporting Compounds

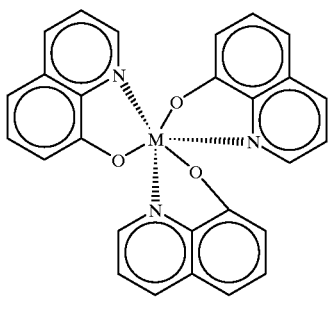
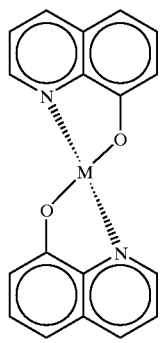
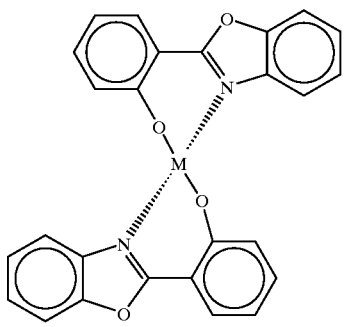

M: Al, Ga    M: Zn, Mg, Be    M: Zn, Mg, Be

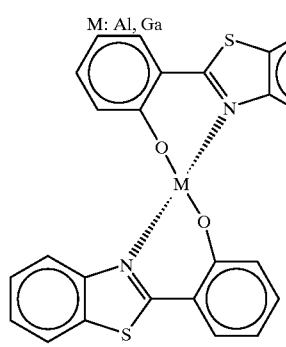
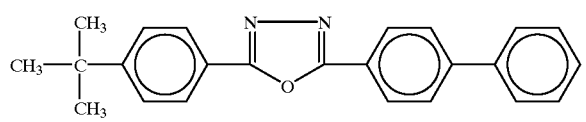

M: Zn, Mg, Be

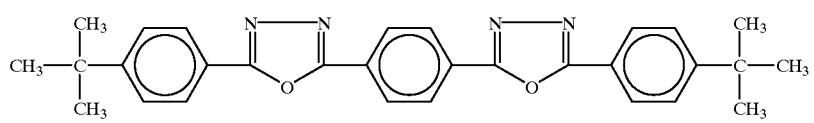
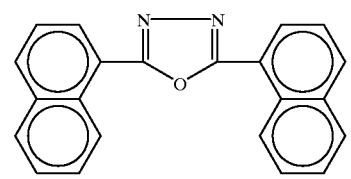

-continued
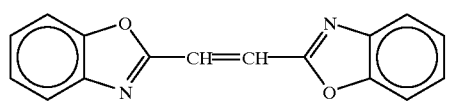
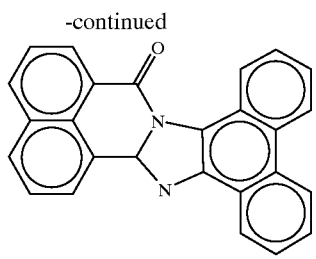
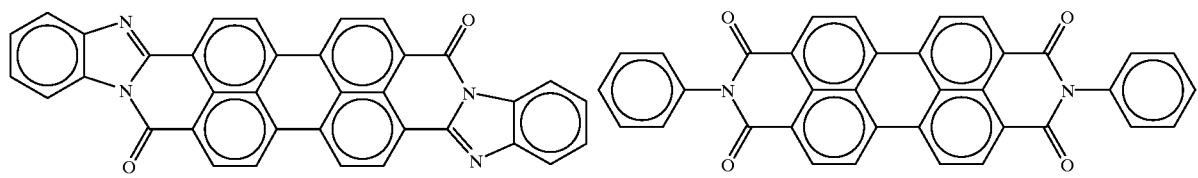
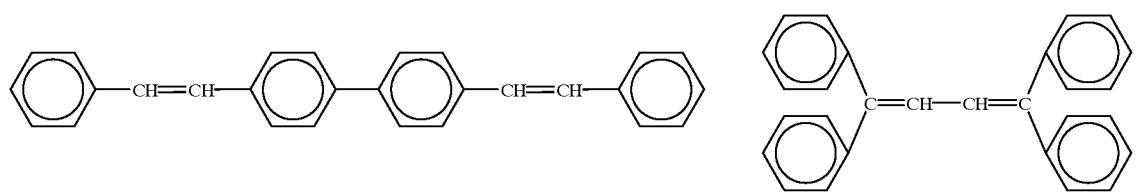
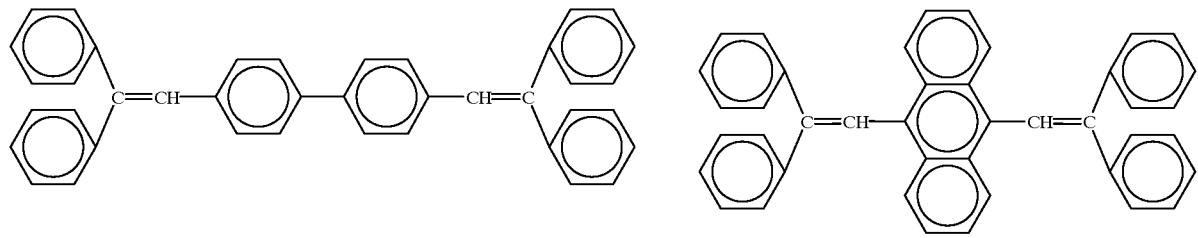
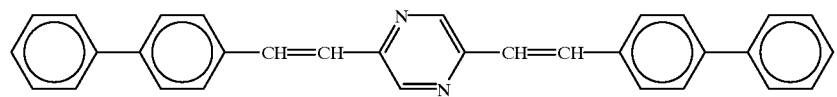
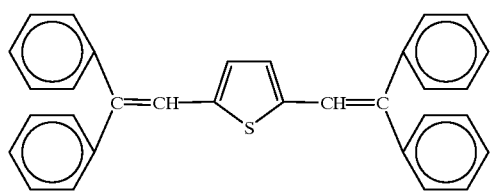

The electron transport layer or the hole transport layer can also be doped with a dopant pigment selected from the following materials.

Dopant Pigments

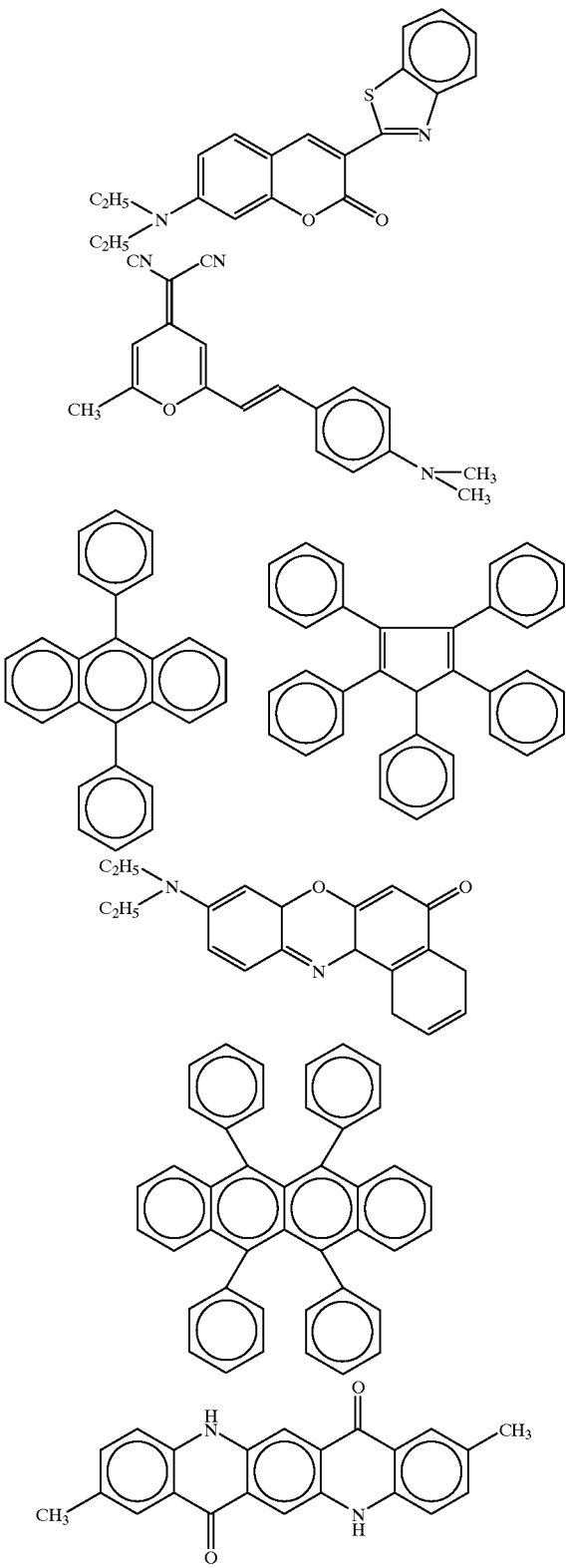

Further, it is preferable to interpose a dielectric layer between the anode layer 202 and the substrate 201. The dielectric layer is formed by depositing a layer of a different refractive index such as $SiO_2$, SiO, or the like, whereby it can increase (or decrease) the reflectance/transmittance at specific wavelengths. Alternatively, it is also possible to simply use a half mirror.

It is preferable to lay a protective layer (sealing layer) on the upper surface of the cathode layer 204 by deposition of an electrically insulative, moisture-proof material thereon in order to protect the surface layer, prevent degradation thereof, and prevent a short of the electrodes.

The CPU 702 carries out the control of each section according to the input data of image information etc. and also carries out the pre-heat control for the array of light emitting elements 707 whereby the temperature of these light emitting elements 707 is kept at a preset object temperature in a waiting state without the input data of image information etc.

The pre-heat control by the CPU 702 is carried out as follows. As illustrated in FIG. 4, when the waiting state without the input data is brought about [step 801], the temperature is first measured by the temperature sensors 706 [step 802]. It is then compared with the object temperature Ts preliminarily stored in the ROM 703 to determine whether the temperature reaches the object temperature Ts [step 803]. When the temperature is below the object temperature Ts [NO at step 803], the light emitting elements 707 are turned on [step 805] and then the CPU returns to step 802 for measurement of temperature. When the temperature reaches the object temperature Ts on the other hand [YES at step 803], it is determined whether the light emitting elements 707 are on [step 804]. When the light emitting elements 707 are on [YES at step 804], the light emitting elements 707 are turned off immediately [step 806] and then the CPU returns to step 802 for measurement of temperature. When the light emitting elements 707 are off [NO at step 804], the CPU directly returns to step 802 for measurement of temperature.

When the light emitting elements 707 are turned on, they generate heat accordingly. Since this operation is carried out during the waiting state without the input data of image information etc., the light emitting elements pre-heat themselves. Therefore, the light emitting elements are kept at the object temperature Ts of pre-heat, indicated by a dashed line, in the waiting state without the input data, as illustrated in FIG. 5.

A signal level for turning the light emitting elements 707 on may be set at a proper level and responsivity of the pre-heat control-can be changed by increasing or decreasing the signal level.

In the apparatus of the present embodiment in the above structure, the temperature sensors 706 laid in the light emitter array 708 detect the temperature of the array of light emitting elements 707 and the CPU 702, receiving detection outputs from the temperature sensors 706, controls on/off of the array of light emitting elements 707 so that detected values become the object temperature Ts in the waiting state without the input data. In this structure, the light emitting elements 707 made of the organic compound are pre-heated by their own heat in the waiting state without the input data and thus are kept at the preset object temperature Ts, so that they can be prevented from being affected by moisture in an ambience, while the dew condensation is prevented. As a result, the light emitting elements 707 of the organic compound can be restrained from being degraded and can thus increase their lifetime.

Since the light emitting elements 707 are kept at the predetermined temperature in the waiting state without the input data, rises of light emissions become better upon primary actuation according to the input data; whereby the initial response of emission actuation can be enhanced and whereby stability of response operation is also improved. Therefore, the exposure section of the electrophotographic method can achieve higher operating speed and higher image quality, which is preferred.

Figure 7:
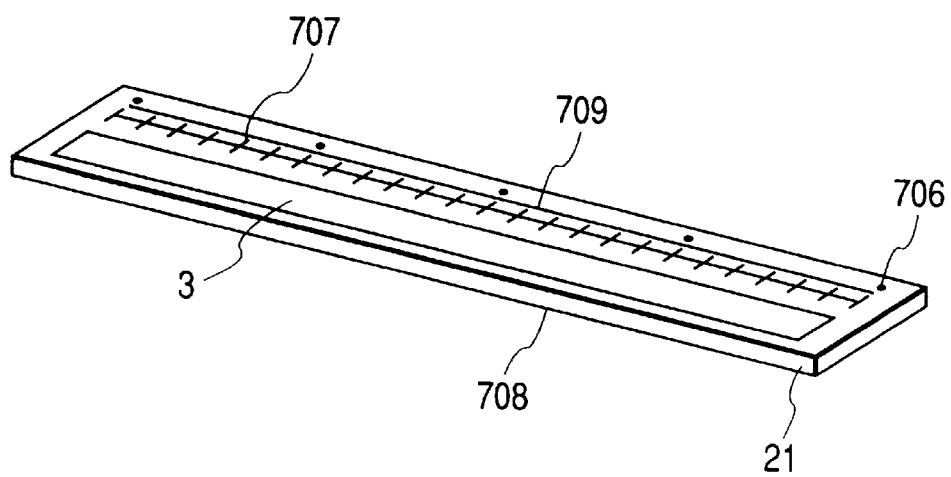
FIG. 7 is a perspective view of a light emitting element array used in the light emitting apparatus of FIG. 6.
Figure 6:
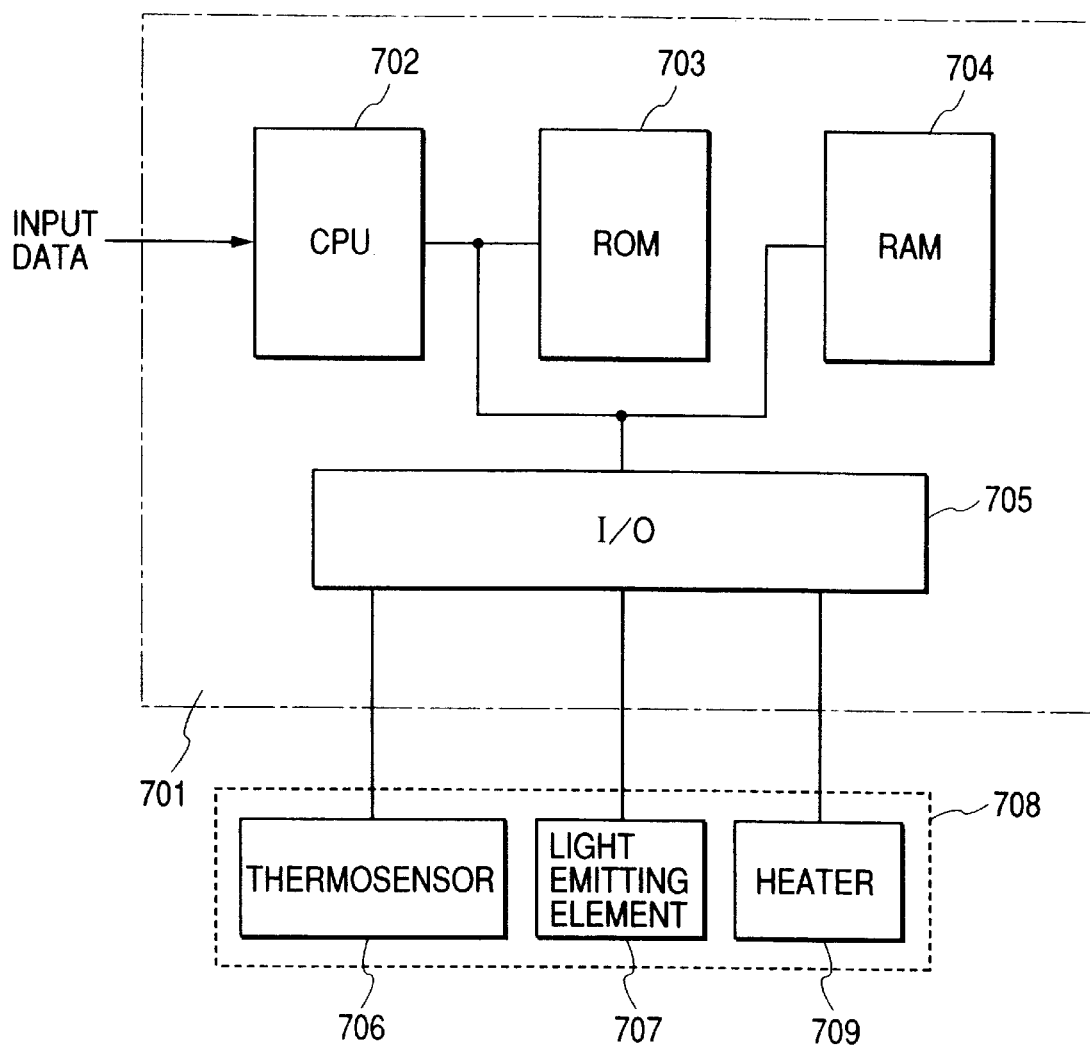
FIG. 6 is a diagram to show a light emitting apparatus according to the second embodiment of the present invention.
Figure 8:
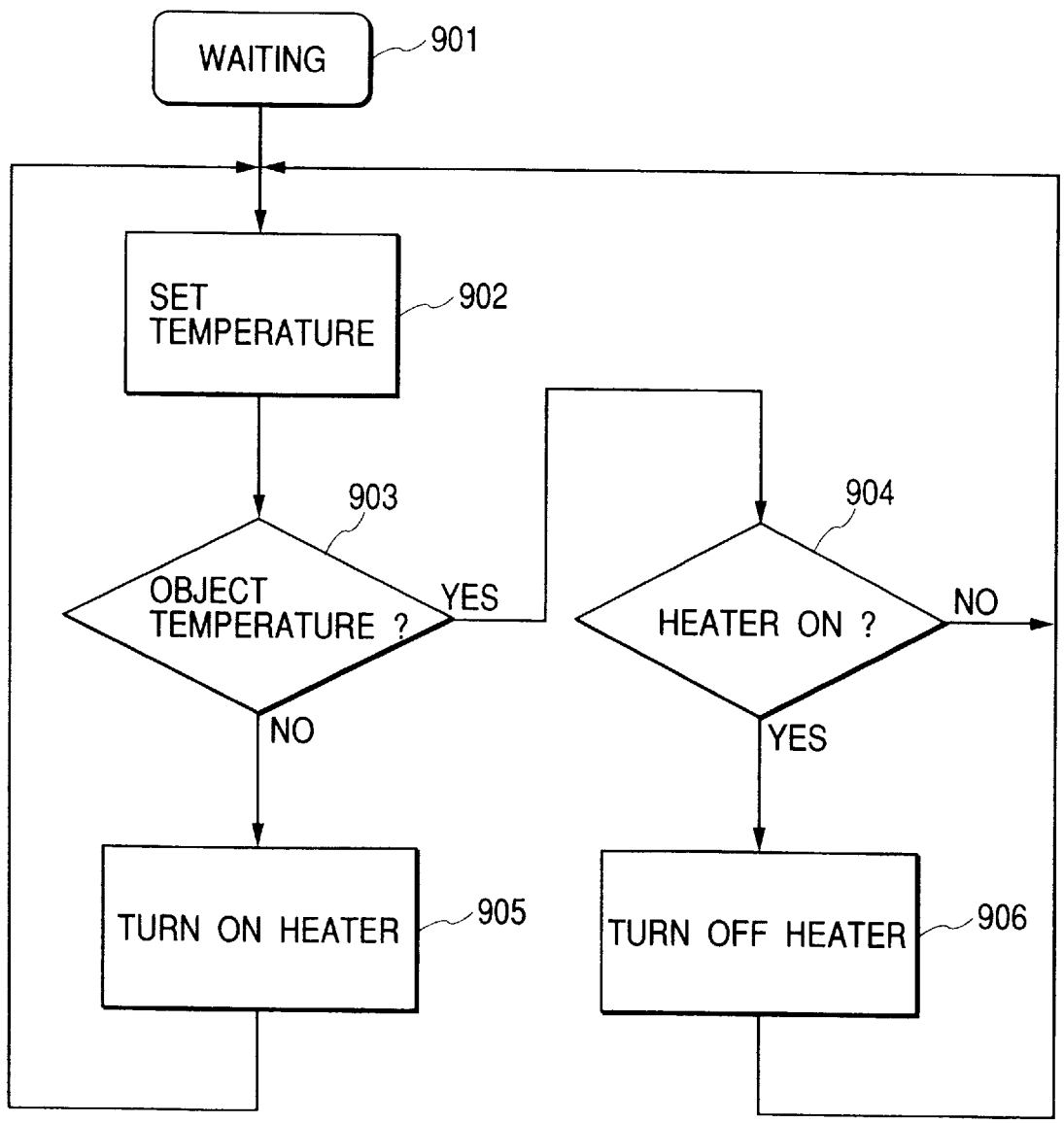
FIG. 8 is a flowchart to show pre-heat control of the light emitting elements of FIG. 6.
Figure 10:
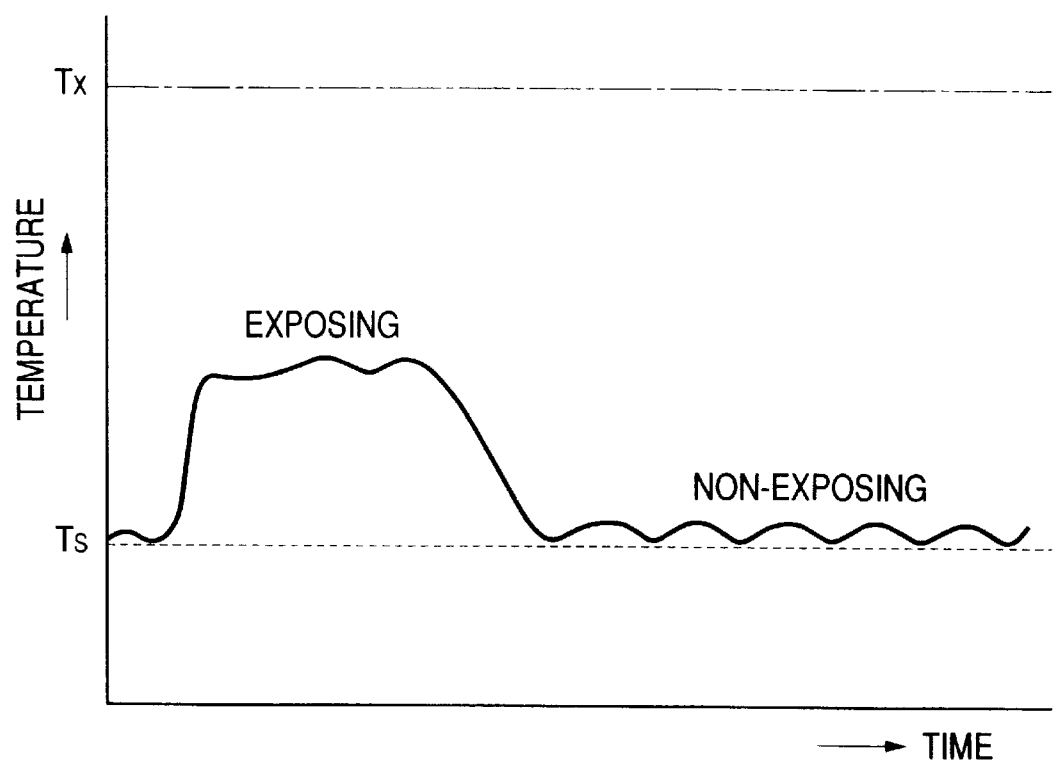
FIG. 10 is a diagram to show the result of measurement in which the temperature of the light emitting element array of the third embodiment was measured.

FIG. 6 shows the structure of the light emitting apparatus and exposure apparatus in the second embodiment of the present invention. FIG. 7 is a perspective view of the light emitter array, FIG. 8 is a flowchart of the pre-heat control of the light emitting elements, and FIG. 10 is a graph to show the result of measurement in which the temperature of the light emitting element array was measured. The structure of the light emitting elements forming the light emitting apparatus of the present embodiment is similar to that illustrated in FIG. 3.

In the light emitting apparatus of the present embodiment, the light emitter array 708 is provided with a heater 709. The other structure is similar to that in the first embodiment. This heater 709, together with the temperature sensors 706 and the light emitting elements 707, is connected to the I/O ports 705.

Referring to FIG. 7, the heater 709 of a long beltlike shape is provided along the array of light emitting elements 707, a plurality of temperature sensors 706 are laid adjacent to the heater 709 at predetermined intervals, and they are connected to the aforementioned I/O ports 705. The distances between the three members of the light emitting elements 707, the heater 709, and the temperature sensors 706 are set so that thermal conduction is approximately equal among them. This is affected greatly by the thermal conduction property of the transparent substrate 21 and the distances between them are set so as to be approximately equal in the present embodiment in consideration of that point.

The heater 709 is an electrothermic heater of an electric resistor, a thin film of the electric resistor being formed in a long beltlike shape, and it is turned on or off by a driving signal sent from the I/O ports 705.

The CPU 702 carries out the control of each section according to the input data of image information etc. and also carries out the pre-heat control for the array of light emitting elements 707 by the heater 709 whereby the temperature of these light emitting elements 707 is kept at the preset object temperature in the waiting state without the input data of image information etc.

The pre-heat control by the CPU 702 is carried out as follows. As illustrated in FIG. 8, when the waiting state without the input data is brought about [step 901], the temperature is first measured by the temperature sensors 706 [step 902]. It is then compared with the object temperature Ts preliminarily stored in the ROM 703 to determine whether the temperature reaches the object temperature Ts [step 903]. When the temperature is below the object temperature Ts [NO at step 903], the heater 709 is turned on [step 905] and then the CPU returns to step 902 for measurement of temperature. When the temperature reaches the object temperature Ts on the other hand [YES at step 903], it is determined whether the heater 709 is on [step 904]. When the heater 709 is on [YES at step 904], the heater 709 is turned off immediately [step 906] and then the CPU returns to step 902 for measurement of temperature. When the heater 709 is off [NO at step 904], the CPU directly returns to step 902 for measurement of temperature.

When the heater 709 is turned on, it generates heat accordingly. Since this operation is carried out during the waiting state without the input data of image information etc., the heater 709 pre-heats the light emitting elements 707. Therefore, the light emitting elements are kept at the object temperature Ts of pre-heat, indicated by a dashed line, in the waiting state without the input data, as illustrated in FIG. 10.

A signal level for turning the heater 709 on may be set at a proper level and the responsivity of the pre-heat control can be changed by increasing or decreasing the signal level.

In the apparatus of the present embodiment in the above structure, the temperature sensors 706 laid in the light emitter array 708 detect the temperature of the array of light emitting elements 707 and the CPU 702, receiving detection outputs from the temperature sensors 706, controls on/off of the heater 709 so that detected values become the object temperature Ts in the waiting state without the input data. In this structure, the light emitting elements 707 made of the organic compound are pre-heated by the heat of the heater 709 in the waiting state without the input data and thus are kept at the preset object temperature Ts, so that they can be prevented from being affected by moisture in an ambience, while the dew condensation is prevented. As a result, the light emitting elements 707 of the organic compound can be restrained from being degraded and can increase their lifetime.

The present embodiment is arranged to carry out the pre-heat control with the heater 709 in the waiting state without the input data of image information etc., but the apparatus may also be constructed so as to always carry out the pre-heat control by making the steps 901 to 906 shown in FIG. 8, active upon on of power of the apparatus. In that case, the array of light emitting elements 707 are turned on and off according to the input data during the primary driving according to the input data to generate heat per se. Then their temperature becomes over the object temperature Ts of the pre-heat control, as illustrated in FIG. 10. At that time, the pre-heat control with the heater 709 is a control operation of keeping the heater 709 off, so that the pre-heat control is canceled substantially, so as to pose no problem.

In the third embodiment of the present invention, the heater 709 of the light emitting apparatus is the electrothermic heater constructed of the electric resistor, the thin film of the electric resistor being formed in the long beltlike shape, and it is arranged to generate heat while being self-balanced at a predetermined temperature.

Preferred materials for the heater 709 are materials of a pigment dispersion type obtained by mixing carbon or the like in a variety of binder resins and, using such materials, a film-form pattern can be formed properly in a desired shape by a thick film process such as the silk screen printing or the like. Electric resistors made of the above materials change their electric resistance in accordance with their own temperature and have a positive correlation characteristic between them. Therefore, because the electric resistance is small at low temperatures, electric current becomes larger to increase the amount of heat, so that the temperature of the resistor becomes high. However, since the electric resistance increases with increase of temperature, electric current becomes lower because of the large electric resistance at high temperatures, so as to decrease the amount of heat. Then, the increase of temperature is stopped, so that it is self-balanced at the predetermined temperature.

As described above, the heater 709 automatically acts to balance its own heat at the predetermined temperature because of the electric characteristics of its component material and maintain the temperature. The temperature at the balance of heat is specific to the electric characteristics of the electric resistor, is freely changed by arbitrarily selecting and blending the component material, and can be set properly thereby.

The CPU 702 carries out the control of each section in accordance with the input data of image information etc. and also carries out the pre-heat control for the array of light emitting elements 707 by the heat of the heater 709. The temperature of those light emitting elements 707 is kept at the predetermined temperature in the waiting state without the input data of image information etc. by the self-balanced heat of the heater 709, and the apparatus is stopped immediately when the heater 709 demonstrates an abnormality in its heating.

Figure 9:
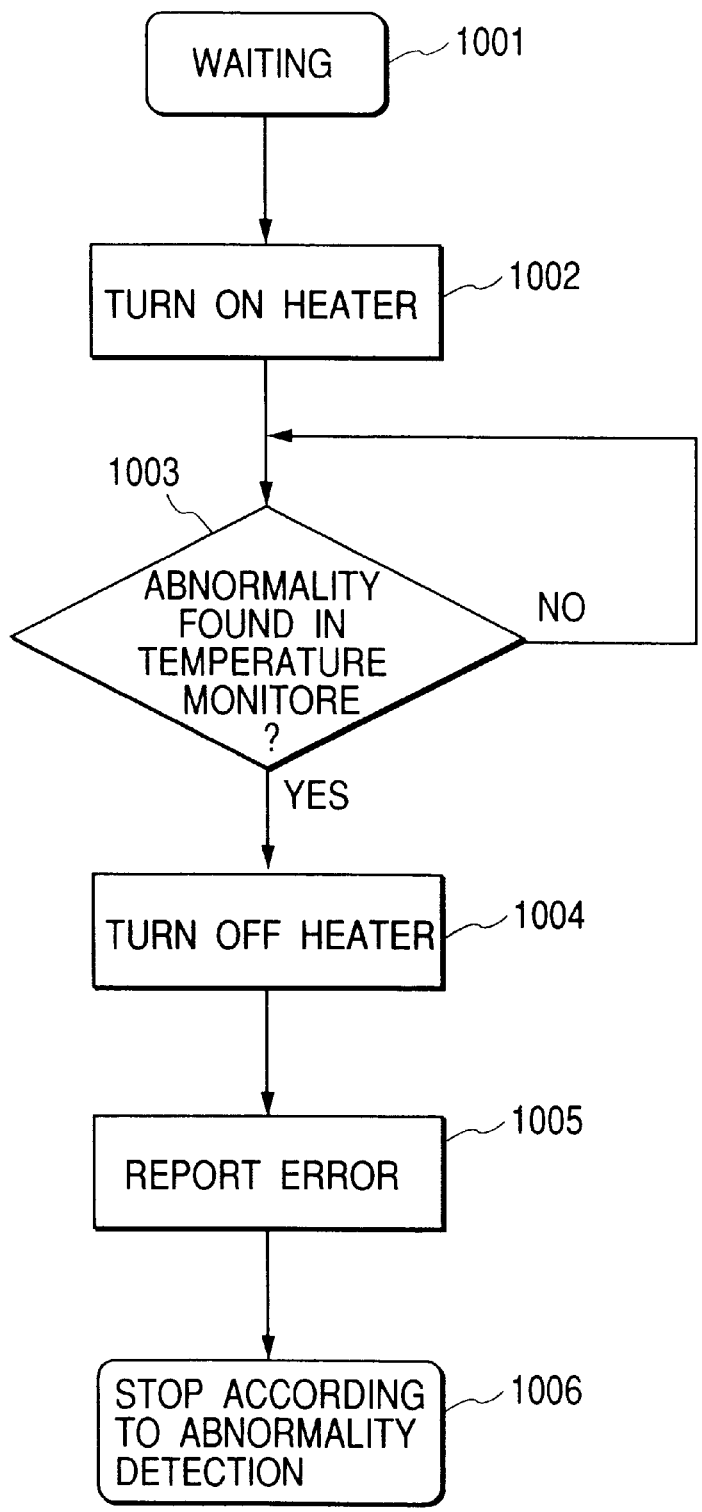
FIG. 9 is a flowchart to show pre-heat control of the light emitting elements in the third embodiment of the present invention.

The pre-heat control by the CPU 702 is carried out as follows. As illustrated in FIG. 9, when the waiting state without the input data is brought about [step 1001], the heater 709 is first turned on [step 1002]. Then the temperature is measured by the temperature sensors 706 and is compared with a limit temperature Tx preliminarily stored in the ROM 703 to check whether the temperature reaches the limit temperature Tx [step 1003]. When the temperature is lower than the limit temperature Tx [NO at step 1003], the CPU goes into a loop to repeat the step 1003. When the temperature reaches the limit temperature Tx on the other hand [YES at step 1003], the heater 709 is turned off immediately [step 1004], an error report is outputted to an external device working in cooperation with the apparatus [step 1005], and the control is transferred to a flow for a stop control upon occurrence of abnormality [step 1006].

Since the heating of the heater 709 is self-balanced at the predetermined temperature because of the electric characteristics of the component material thereof to retain the balanced temperature in normal operation as described previously, the heater 709 heats the light emitting elements 707 adjacent thereto rarely reaching the limit temperature Tx. Since this is carried out during the waiting state without the input data of image information etc., the light emitting elements 707 are pre-heated thereby to be maintained at the predetermined temperature Ts indicated by a dashed line, as illustrated in FIG. 10, in the waiting state without the input data.

During the primary driving according to the input data the temperature of the array of light emitting elements 707 exceeds the set temperature Ts of pre-heat by the heat of the heater 709, as illustrated in FIG. 10, because of the self-heating of the light emitting elements 707 turned on and off according to the input data. Therefore, the limit temperature Tx is set to the sum of a margin plus the temperature during the primary driving according to the input data as illustrated in FIG. 10.

In the apparatus of the present embodiment in the above structure, since the heater 709 is laid near the light emitting elements 707, the heating thereof is self-balanced at the predetermined temperature Ts when the heater 709 is activated in the waiting state without the input data. Thanks to this, the light emitting elements 707 made of the organic compound are pre-heated by the self-balanced heating of the heater 709 in the waiting state without the input data to be kept at the predetermined temperature Ts preliminarily set; therefore, the light emitting elements 707 can be prevented from being affected by moisture in the ambience and the dew condensation can be prevented. This can restrain the degradation of the light emitting elements 707 made of the organic compound and thus increase their lifetime.

At this time, because the heating of the heater 709 is self-balanced at the predetermined temperature Ts because of the electric characteristics of its component material, an extra control system is not necessary for the temperature balance and thus cost can be reduced because of simplification of the structure, which is preferred.

The temperature of the light emitting elements 707 can become considerably high because the pre-heat by the heater 709 is added to the self-heat. Therefore, the pre-heating by the heater 709 is preferably carried out in the waiting state without the input data in order to suppress increase of temperature.

Figure 11:
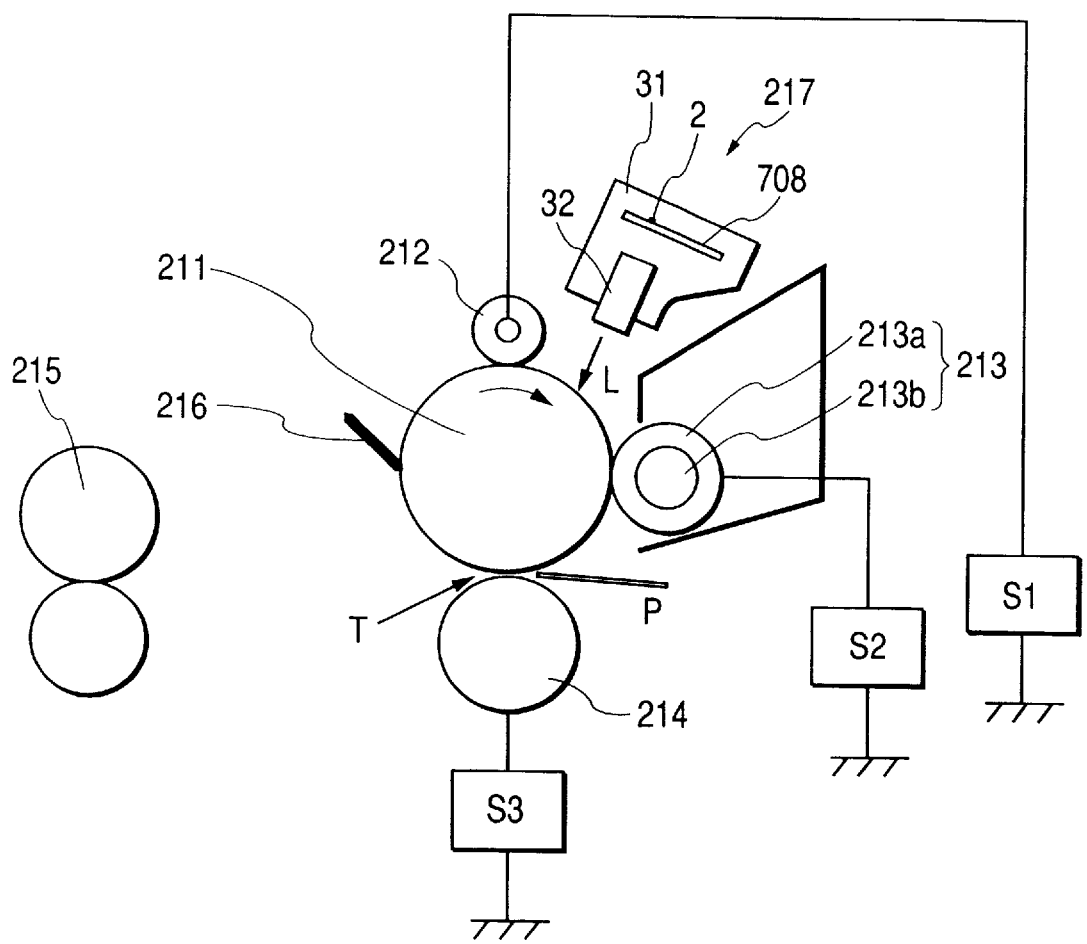
FIG. 11 is a diagram to show an image forming apparatus of the electrophotographic method according to an embodiment of the present invention.

FIG. 11 shows an example of the image forming apparatus using the exposure apparatus according to the present invention and is a structural diagram of the image forming apparatus of the electrophotographic method.

This image forming apparatus is constructed in such structure that around a photosensitive body 211 of a rotary drum type as an image carrier there are a charging unit 212, a developing unit 213, a transferring unit 214, and a cleaning unit 216 arranged in the stated order, that an exposure unit 217 is disposed between the charging unit 212 and the developing unit 213, and that a fixing unit 215 is placed in a discharge path of transfer medium P such as a recording sheet or the like.

The exposure unit 217 is an application of the exposure apparatus of the present invention and is constructed in structure in which a SELFOC lens array 32 is disposed in front of the light emitter array 708 so that the SELFOC lens array 32 can guide exposure light L of emission output from the light emitter array 708 well so as to focus the exposure light L on the photosensitive member 211 and obtain a good latent image thereon.

In forming the image, the surface on the photosensitive member 211 is first uniformly charged by the charging unit 212. This charged surface of the photosensitive member 211 is exposed to the exposure light L from the exposure unit 217 in accordance with time-series, electrical, digital pixel signals of image information, whereupon the electrostatic, latent image corresponding to the image information is formed on the peripheral surface of the photosensitive member 211. The electrostatic, latent image is developed as a toner image by the developing unit 213 with insulating toner. On the other hand, a sheet feed section (not illustrated) supplies a transfer medium P as a recording medium and the transfer medium P is guided at predetermined timing to a contact nip portion (transfer portion) T between the photosensitive member 211 and the transfer unit 214 urged against it under predetermined pressure. The image is transferred onto the transfer medium P by applying a predetermined transfer bias voltage.

The transfer medium P after the transfer of the toner image is separated from the surface of the photosensitive member 211 to be guided into the fixing unit 215 of the thermal fixing method or the like, in which the toner image is fixed. Then the transfer medium P is discharged as an image-formed object (print) out of the apparatus. After the transfer of the toner image onto the transfer medium P, the surface of the photosensitive member 211 is cleaned by removing deposited contaminants including the residual toner or the like by the cleaning unit 216, and then is used repeatedly for formation of latent image.

In this case, the exposure unit 217 for carrying out the exposure process of electrophotography is comprised of the exposure apparatus of the present invention, and because of this structure the organic light emitting elements of the exposure apparatus are pre-heated by their own heat or by the heater provided separately in the waiting state without the input data so as to be kept at the predetermined temperature; therefore, this structure can prevent the elements from being affected by moisture in the ambience and can also prevent the dew condensation. As a result, the structure of the present embodiment can suppress the degradation of the organic light emitting elements and can increase their lifetime; therefore, it is preferably applied to the exposure section of the electrophotographic method. Since the organic light emitting elements are pre-heated, rises of emissions become better during the primary driving according to the input data and the initial response of emission actuation can be enhanced. Therefore, the stability of response operation is also improved. Since the higher operating speed and the higher quality of image can be achieved for the exposure unit of the electrophotographic method, the structure of the present invention is preferred.

Figure 12:
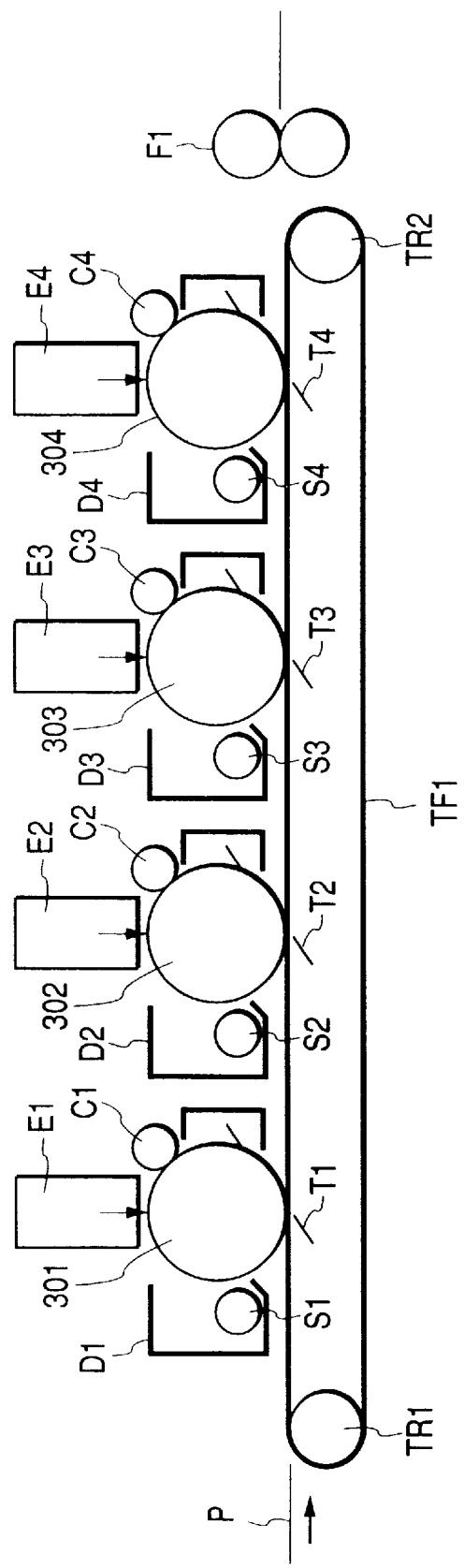
FIG. 12 is a diagram to show an image forming apparatus of the electrophotographic method according to another embodiment of the present invention.

FIG. 12 shows another example of the image forming apparatus using the exposure apparatus according to the present invention and is a structural diagram of the multi-color image forming apparatus by the electrophotographic method.

This image forming apparatus is constructed in such structure that four process configurations from electrophotography to transfer are arranged in series in order to carry out formation of multi-color image and that the transfer medium P is conveyed through the series of four process configurations in order, to the fixing unit F1.

Specifically, photosensitive members 301 to 304 of the rotary drum type are arranged in order from the upstream of a transfer belt TF1 stretched between two rollers TR1, TR2, and around each of the four photosensitive embers 301 to 304 there are a charging unit C1 to C4, an exposure unit E1 to E4 as an application of the exposure apparatus of the present invention, a developing unit D1 to D4 provided with a developing sleeve S1 to S4, and a transfer blade T1 to T4. Further, a fixing unit F1 is provided in a discharge path of transfer medium P.

The transfer medium P is conveyed in the direction of an arrow to be guided onto the transfer belt TF1 stretched between the rollers TR1, TR2. Then the transfer medium P is conveyed by the transfer belt TF1 to a black transfer position set so as to be sandwiched between the photosensitive member 301 and the transfer blade T1. At this time, the photosensitive member 301 has a predetermined toner image of black through the electrophotographic process with the charging unit C1, exposure unit E1, and developing sleeve S1 of the developing unit D1 arranged on the drum periphery thereof, and the black toner image is transferred onto the transfer medium P.

Then the transfer medium P is conveyed by the transfer belt TF1 successively to a cyan transfer position set so as to be sandwiched between the photosensitive member 302 and the transfer blade T2, to a magenta transfer position set so as to be sandwiched between the photosensitive member 303 and the transfer blade T3, and to a yellow transfer position set so as to be sandwiched between the photosensitive member 304 and the transfer blade T4. At each of the transfer positions, a cyan toner image, a magenta toner image, or a yellow toner image is transferred onto the transfer medium P by the process similar to that at the black transfer position.

In this case, the registration of image is effected well between each transfer and recording, because the photosensitive members 301 to 304 are rotating in good order. The transfer medium P after the multi-color recording according to the above processes is guided to the fixing unit F1 to undergo fixing, thereby obtaining a desired multi-color image.

Since such multi-color image forming apparatus has the plurality of electrophotographic processes, plural and multiple effects can appear because of the problem due to the organic light emitting elements in the conventional exposure apparatus, i.e., the problem of shortening the lifetime by the degradation of the organic light emitting elements due to moisture in the ambience. In contrast with it, the apparatus of the present embodiment is provided with the exposure units E1 to E4 based on the exposure apparatus of the present invention, so that the organic light emitting elements in each of the exposure units are pre-heated by their own heat or by the heat of the heater in the waiting state without the input data so as to be kept at the set temperature; whereby they are prevented from being affected by moisture in the ambience and the dew condensation can be prevented. As a result, the effects of the problem can be relieved even in the structure composed of the plural configurations and thus the structure of the present embodiment is preferable to the exposure sections of the multi-color electrophotographic method. Since the organic light emitting elements are pre-heated, rises of emissions become better during the primary driving according to the input data and the initial response of emission actuation can be improved. The stability of response operation is also enhanced. Therefore, the structure of the present embodiment is preferably applied to the exposure sections of the multi-color electrophotographic method so as to achieve higher operating speed and higher quality of image and be able to obtain a multi-color image with high quality.

As described above, according to the present invention, the temperature detecting means detects the temperature of the organic light emitting elements and the control means, receiving the detection output from the temperature detecting means, turns the organic light emitting elements on and off so that a detected value becomes the predetermined value in the waiting state without the input data. Thanks to this, the organic light emitting elements are pre-heated by their own heat in the waiting state without the input data to be kept at the predetermined temperature preliminarily set; therefore, they can be prevented from being affected by moisture in the ambience and the dew condensation can be prevented. As a result, the structure according to the invention can restrain the degradation of the light emitting elements made of the organic compound and can increase their lifetime.

Since the organic light emitting elements are kept at the predetermined temperature in the waiting state without the input data, rises of emissions become better during the primary driving according to the input data, the initial response of emission actuation can also be improved, and the stability of response operation is also enhanced.

Therefore, the structure of the present invention is preferably applied to the exposure section of the electrophotographic method so as to achieve the higher operating speed and higher quality of image.

What is claimed is:

1. A light emitting apparatus which comprises a light emitting element array comprised of a plurality of organic light emitting elements and which is arranged to drive said light emitting element array in accordance with input data, said light emitting apparatus comprising control means for performing such control that said light emitting elements are kept at a fixed temperature to prevent the degradation of the light emitting elements due to water.

2. The light emitting apparatus according to claim 1, wherein said organic light emitting elements are comprised of an anode layer, a cathode layer, and a single organic compound layer or plural organic compound layers sandwiched between the anode and cathode layers, which are formed on a substrate.

3. The light emitting apparatus according to claim 1 or 2, further comprising temperature detecting means for detecting temperature of said light emitting elements, wherein said control means performs such control that said light emitting elements are kept at the fixed temperature in accordance with a detected temperature signal from said temperature detecting means.

4. The light emitting apparatus according to claim 3, wherein said temperature detecting means is placed near said light emitting elements.

5. The light emitting apparatus according to claim 3, wherein said temperature detecting means and said light emitting elements are disposed on a common substrate.

6. The light emitting apparatus according to claim 4, wherein said temperature detecting means and said light emitting elements are disposed on a common substrate.

7. The light emitting apparatus according to claim 3, wherein said temperature detecting means is formed by a process similar to a process for forming said light emitting elements.

8. The light emitting apparatus according to claim 3, wherein said control means maintains the temperature of said light emitting elements constant by controlling on/off of said light emitting elements in accordance with said detected temperature signal, in a waiting state without said input data.

9. The light emitting apparatus according to claim 3, wherein said control means controls on/off of the light emitting elements so as to keep signal levels of said detected temperature signal constant.

10. The light emitting apparatus according to claim 3, further comprising heat generating means, wherein said control means maintains the temperature of said light emitting elements constant by activating said heat generating means in accordance with said detected temperature signal.

11. The light emitting apparatus according to claim 10, wherein said control means maintains the temperature of said light emitting elements constant by driving said heat generating means in accordance with said detected temperature signal in a waiting state without said input data.

12. The light emitting apparatus according to claim 10, wherein said control means drives the heat generating means so as to keep signal levels of said detected temperature signal constant.

13. The light emitting apparatus according to claim 10, wherein said heat generating means is placed near said light emitting elements.

14. The light emitting apparatus according to claim 10, wherein said heat generating means and said light emitting elements are provided on a common substrate.

15. The light emitting apparatus according to claim 10, wherein said heat generating means is formed by a process similar to a process for forming said light emitting elements.

16. The light emitting apparatus according to claim 10, wherein the distance between said light emitting elements and said heat generating means is approximately equal to the distance between said heat generating means and said temperature detecting means.

17. An image forming apparatus for effecting exposure on a photosensitive member by the light emitting apparatus as set forth in claim 16, to form an image on a photosensitive member.

18. The apparatus according to claim 17, wherein said light emitting apparatus further comprises heat generating means, and wherein said control means maintains the temperature of said light emitting elements constant by activating said heat generating means in accordance with said detected temperature signal.

19. An exposure apparatus for effecting exposure on a photosensitive member by a light emitting apparatus comprising a light emitting element array comprised of a plurality of organic light emitting elements driven in accordance with input data, temperature detecting means for detecting temperature of said light emitting elements, and control means for performing such control that said light emitting elements are kept at a fixed temperature in accordance with a detected temperature signal from said temperature detecting means to prevent the degradation of the light emitting elements due to water.

20. The apparatus according to claim 19, where in said light emitting apparatus further comprises heat generating means, and wherein said control means maintains the temperature of said light emitting elements constant by activating said heat generating means in accordance with said detected temperature signal.

* * * * *

UNITED STATES PATENT AND TRADEMARK OFFICE
CERTIFICATE OF CORRECTION

PATENT NO.    : 6,266,074 B1
DATED         : July 24, 2001
INVENTOR(S)   : Noboru Koumura et al.

It is certified that error appears in the above-identified patent and that said Letters Patent is hereby corrected as shown below:

Sheet No. 7,
Figure 9, "MONITORE" should read -- MONITOR --.

Column 8,
Line 26, "Alq$^3$" should read -- Alq$_3$ --.

Column 12,
Line 50, "control-can" should read -- control can --.

Column 14,
Line 32, "on" should read -- ON --.

Column 16,
Line 56, "section. (not illustrated)" should read -- section (not illustrated) --.

Column 20,
Line 46, "where in" should read -- wherein --.

Signed and Sealed this

Twenty-sixth Day of February, 2002

Attest:

Attesting Officer

JAMES E. ROGAN
*Director of the United States Patent and Trademark Office*